United States Patent
Lacroix et al.

(10) Patent No.: US 9,599,664 B2
(45) Date of Patent: Mar. 21, 2017

(54) CIRCUIT FOR DETECTING STRUCTURAL DEFECTS IN AN INTEGRATED CIRCUIT CHIP, METHODS OF USE AND MANUFACTURE AND DESIGN STRUCTURES

(71) Applicant: INTERNATIONAL BUSINESS MACHINES CORPORATION, Armonk, NY (US)

(72) Inventors: Luke D. Lacroix, Williston, VT (US); Mark C. H. Lamorey, Williston, VT (US); Steven F. Oakland, Colchester, VT (US); Janak G. Patel, South Burlington, VT (US); Kerry P. Pfarr, Rochester, MN (US); Peter Slota, Jr., Vestal, NY (US); David B. Stone, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/713,626

(22) Filed: May 15, 2015

(65) Prior Publication Data
US 2015/0247896 A1 Sep. 3, 2015

Related U.S. Application Data

(63) Continuation of application No. 13/010,057, filed on Jan. 20, 2011, now Pat. No. 9,057,760.

(51) Int. Cl.
*G01R 31/3187* (2006.01)
*G01R 31/28* (2006.01)
(Continued)

(52) U.S. Cl.
CPC .... *G01R 31/2884* (2013.01); *H01L 21/76895* (2013.01); *H01L 22/32* (2013.01); *G01R 31/2896* (2013.01)

(58) Field of Classification Search
CPC .......... G01R 31/2884; H01L 21/76895; H01L 22/32
See application file for complete search history.

(56) References Cited

U.S. PATENT DOCUMENTS

| 5,625,288 A | 4/1997 | Snyder et al. |
| 5,912,562 A | 6/1999 | Pappert et al. |
(Continued)

FOREIGN PATENT DOCUMENTS

| CN | 1763553 | 4/2006 |
| JP | 6077300 | 3/1994 |
| TW | 486806 | 5/2002 |

OTHER PUBLICATIONS

Chiang et al., Design for Manufacturability and Yield for Nano-Scale CMOS, Springer Science & Business Media, 2007, p. 99.*

(Continued)

*Primary Examiner* — Daniel Miller
(74) *Attorney, Agent, or Firm* — Anthony Canale; Andrew M. Calderon; Roberts Mlotkowski Safran Cole & Calderon P.C.

(57) ABSTRACT

Detection circuits, methods of use and manufacture and design structures are provided herein. The structure includes at least one signal line traversing one or more metal layers of an integrated circuit. Circuitry is coupled to the at least one signal line, which is structured to receive a signal with a known signal from the at least one signal line or a signal from a different potential and, based on which signal is received, determine whether there is a structural defect in the integrated circuit.

19 Claims, 5 Drawing Sheets

(51) Int. Cl.
*H01L 21/768* (2006.01)
*H01L 21/66* (2006.01)

(56) References Cited

U.S. PATENT DOCUMENTS

| | | | |
|---|---|---|---|
| 6,686,750 B2 | 2/2004 | Watanabe et al. | |
| 7,256,475 B2 | 8/2007 | Jao et al. | |
| 7,339,816 B1* | 3/2008 | Dastidar | H03K 19/1776 |
| | | | 365/154 |
| 7,545,161 B2 | 6/2009 | Hsu et al. | |
| 7,598,749 B1 | 10/2009 | Ang et al. | |
| 7,649,200 B1 | 1/2010 | Miller et al. | |
| 7,683,627 B2 | 3/2010 | Tsukuda | |
| 7,859,285 B2 | 12/2010 | Sheu et al. | |
| 2006/0098499 A1* | 5/2006 | Joshi | G11C 11/413 |
| | | | 365/189.08 |
| 2006/0100811 A1 | 5/2006 | Bhushan et al. | |
| 2006/0226847 A1 | 10/2006 | Fure et al. | |
| 2007/0038404 A1 | 2/2007 | Kapur et al. | |
| 2008/0203388 A1 | 8/2008 | He et al. | |
| 2009/0201043 A1 | 8/2009 | Kaltalioglu | |
| 2010/0117226 A1* | 5/2010 | Yang | H01L 21/561 |
| | | | 257/737 |
| 2010/0153043 A1* | 6/2010 | Su | H01L 22/34 |
| | | | 702/71 |
| 2010/0258335 A1 | 10/2010 | Arvin et al. | |
| 2011/0080184 A1* | 4/2011 | Wu | G01R 31/2853 |
| | | | 324/750.3 |

OTHER PUBLICATIONS

International Search Report for Application No. PCT/US12/21411 dated May 15, 2012.
Written Opinion of the International Searching Authority for Application No. PCT/US12/21411 dated May 15, 2012.
PSPICE, available at http://en.wikipedia.org/wiki/PSPICE on Sep. 18, 2010, in U.S. Appl. No. 13/010,057.
Riley, Under Bump Metallization, 2001 available at http://flipchips.com/tutorial/process/under-bump-metallization-ubm/, in U.S. Appl. No. 13/010,057.
Schilling, et al., Electronic Circuits, 3rd edition, 1989, pp. 151-152, in U.S. Appl. No. 13/010,057.

* cited by examiner

CIRCUIT FOR DETECTING STRUCTURAL DEFECTS IN AN INTEGRATED CIRCUIT CHIP, METHODS OF USE AND MANUFACTURE AND DESIGN STRUCTURES

FIELD OF THE INVENTION

The invention relates to semiconductor structures and methods of manufacture and, more particularly, to detection circuits, methods of use and manufacture and design structures.

BACKGROUND

Semiconductor device manufacturing methods often employ back end of line (BEOL) processes to add interconnect wiring to integrated circuit (IC) devices. For example, in numerous applications, multiple layers of dielectric material (often referred to as interlayer dielectric, or ILD) are formed on a chip. The layers of dielectric material are patterned and etched to form trenches that are later filled with conducting material (e.g., copper) to form vias and wires that connect devices (e.g., RAM) in the chip to other components (e.g., motherboard). Conventional high speed chips may have as many as five to ten wiring layers.

Historically, dense metal oxides such as, for example, silicon dioxide ($SiO_2$), have been used as the dielectric material in interconnect structures. While $SiO_2$ is an excellent insulator with high modulus and hardness, and has a coefficient of thermal expansion (CTE) close to silicon, the dielectric constant (k) is approximately 4.0, which is too high for advanced generation interconnects. As such, device manufacturers are migrating toward the use of low-k (e.g., k<3.0) dielectric materials (such as, for example, inorganic polymers, organic polymers such as polyamides, spin-on glasses, silsesquioxane-based materials, etc.). Generally speaking, low-k dielectric materials serve to increase the speed of the conducting wires, thereby increasing the speed of the semiconductor device.

However, integrating low-k dielectric materials into the wafer BEOL results in delamination stresses that occur when the chip is packaged. The delamination of the chip in the low-k dielectric material layers due to their weaker mechanical properties (e.g., modulus and adhesion) may result in failure of the semiconductor device.

For example, stresses are imparted to the chip due to differences in CTE between the chip and the different materials used in semiconductor packaging. Illustratively, a Silicon chip has a relatively low CTE, while an organic carrier that the low-k chip is disposed upon may have a relatively high CTE. Also, each wiring level may be composed of a different low-k dielectric material, each having differing coefficients of thermal expansion. When the chip is assembled to an organic carrier at an elevated temperature and subsequently cooled, and when a chip undergoes thermal cycling during reliability testing, the differences in CTE between adjacent layers cause stresses at the interface between the layers. These stresses can lead to structural damage of the chip, including cracks in individual layers and delamination between adjacent layers, also known as "white bumps". Structural damage, in turn, renders a chip unusable, thereby decreasing yield and posing a reliability risk.

Accordingly, there exists a need in the art to overcome the deficiencies and limitations described hereinabove.

SUMMARY

In a first aspect of the invention, a structure comprises at least one signal line traversing one or more metal layers of an integrated circuit. The structure further comprises circuitry coupled to the at least one signal line, the circuitry being structured to receive a signal with a known voltage potential and, based on which signal is received, determine whether there is a structural defect in the integrated circuit.

In another aspect of the invention, a structure comprises an input stage comprising at least one signal line traversing metal layers of an integrated circuit and which receives a signal. The structure further includes a detection circuitry coupled to an output of the signal line and ground. The detection circuitry is structured to: receive a known signal from the least one signal line when the signal line maintains its continuity; and receive an opposite or different signal from the expectation when the at least one signal line is partially or completely broken. The signal being as expected is indicative of no structural defects detected by the detection circuitry. The signal being different from the expectation is indicative of structural defects detected by the detection circuitry.

In yet another aspect of the invention, a method of detecting a structural defect in an integrated circuit comprises receiving a known signal from the least one signal line when the signal line maintains its continuity; and receiving an opposite or different signal from the expectation when the at least one signal line is partially or completely broken. The signal being as expected is indicative of no structural defects detected by the detection circuitry. The signal being different from the expectation is indicative of structural defects detected by the detection circuitry.

In still another aspect of the invention, a method of forming a detection circuit comprises forming a continuous signal line in one or more vias extending between metal layers and dielectric layers of an integrated circuit. The method further comprises forming a detection circuit connecting to the continuous signal line and ground, and which receives a signal from the continuous signal line and ground to determine whether delamination has occurred with any of the dielectric layers in which the continuous signal line spans. In another aspect of the invention, a structure comprises at least one signal line traversing a shadow of a bump of an integrated circuit. The circuitry is coupled to the at least one signal line. The circuitry is structured to receive a signal with a known voltage from at least one signal line and if that voltage is not detected, determining that there is a structural defect in the integrated circuit.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the detection circuitry, which comprises the structures of the present invention. In still further embodiments, a method in a computer-aided design system is provided for generating a functional design model of the detection circuitry. The method comprises generating a functional representation of the structural elements of the detection circuitry.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to detection (e.g., test) circuits, methods of use and manufacture and design structures. More specifically, the present invention relates to an electrical test circuit provided in an integrated circuit chip, designed to detect structural defects of the integrated circuit chip due to delaminating of one or more dielectric layers or other "white bump" issues. For example, the electrical test circuit is designed to provide a signal upon detection of a structural defect (e.g., white bumps) in the integrated circuit chip. Advantageously, the electrical test circuit of the present invention can be integrated directly into the integrated circuit chip with minimal or no additional processing steps.

According to embodiments of the invention, the electrical test circuit includes a signal line extending across or between metal and dielectric layers in any given level of the integrated circuit, under a shadow of a bump; although other locations are also contemplated by the present invention. For example, the electrical test circuit of the present invention can be placed (formed) in a via in the dielectric layer, e.g., ultra low-k (ULK) dielectric layer, which are under the shadow of the bump. The signal line spans one or more metal wiring layers, e.g., dielectric layers, and connects to, for example, a sense amp comprising a PFET (connected to GND) and an inverter or NAND gate (connected to a digital scan chain).

Figure 1:
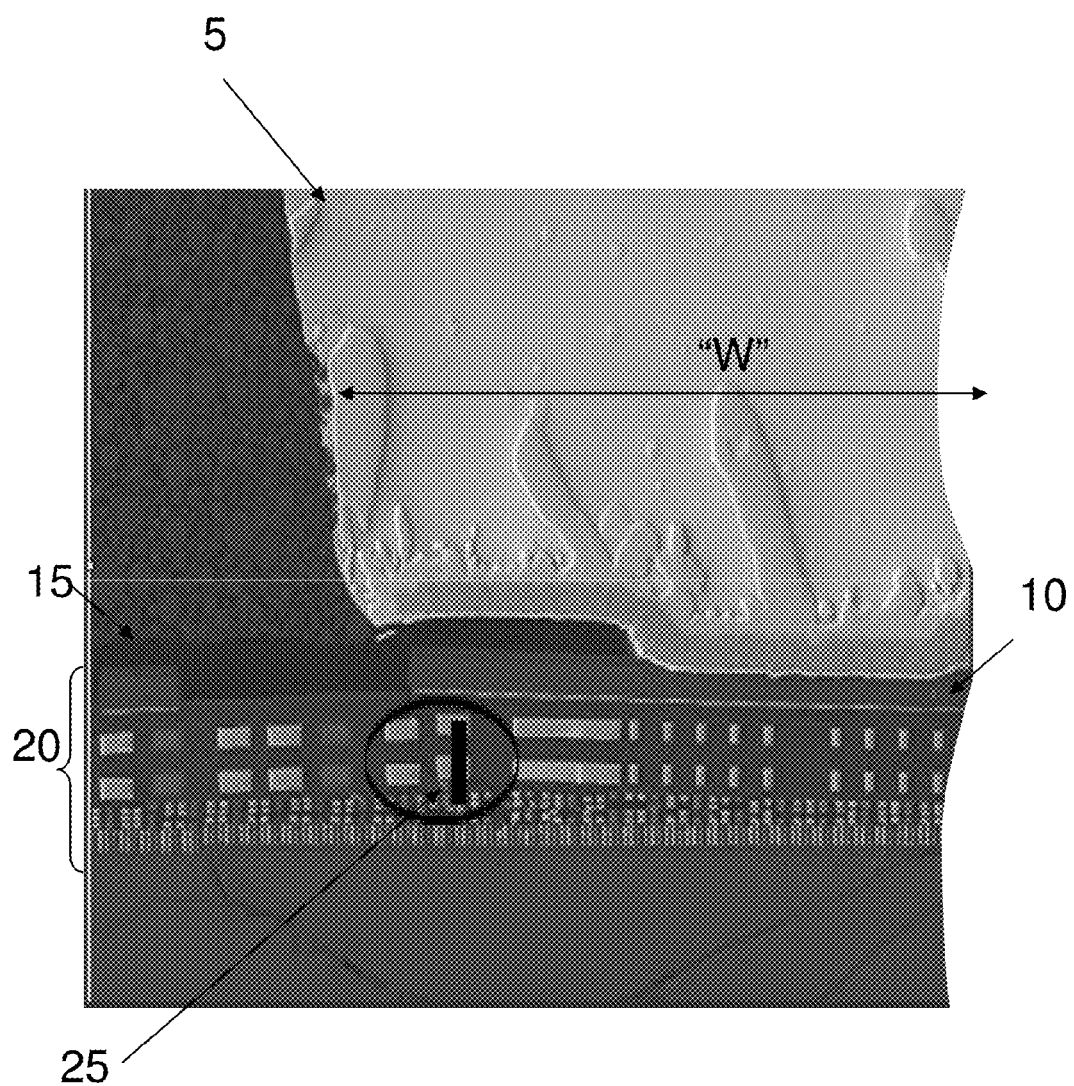
FIG. 1 shows an integrated circuit chip implementing an electrical test circuit in accordance with aspects of the present invention.

FIG. 1 shows an integrated circuit chip implementing the electric circuit in accordance with aspects of the present invention. More specifically, the integrated circuit chip includes, for example, a solder bump 5 formed on an underbump metallurgy (UBM) and pad structure 10, known to those of skill in the art. The underbump metallurgy and pad structure 10 can be one or more metal layers, deposited on an upper dielectric layer 15 and within a via formed in the upper dielectric layer 15 of the integrated circuit chip. For example, in embodiments, the under-bump metallurgy generally comprises successive layers of metal including an adhesion layer, e.g., titanium tungsten (TiW), which adheres to the bond pad metal and the surrounding passivation (e.g., dielectric layer). The underbump metallurgy and pad structure 10 may also include a diffusion barrier layer, which limits the diffusion of solder into the underlying material. The underbump metallurgy and pad structure 10 may also include a wettable layer, e.g., copper wetting layer, which is used for bonding of the solder to the underlying metal. A protective layer, e.g., gold layer, may also be used to prevent oxidation of the underlying layer.

The solder bump 5 can be formed, e.g., deposited, on the underbump metallurgy and pad structure 10 in any known conventional manner such as, for example, plated bump. The solder bump 5 includes a certain width "W". Circuitry, e.g., metal lines, passive and active devices, etc., provided underneath the width "W", of the of the solder bump 5 is said to be within a shadow of the solder bump 5.

The integrated circuit shown in FIG. 1 also includes a plurality of dielectric layers, e.g., ultra low-k (ULK) dielectric layers, and metal layers, generally shown at reference numeral 20. The dielectric layers and metal layers 20 are manufactured using conventional CMOS technologies. For example, the dielectric layers can be deposited using conventional chemical vapor deposition (CVD) processes, etched to form vias and filled with metal to form the metal layers.

Still referring to FIG. 1, the circuitry under the solder bump 5 also includes electrical test circuit 25 of the present invention. In embodiments, the electrical test circuit 25 can detect structural defects in the dielectric layers and/or metal layers 20 caused by, for example, white bumps or other structural defects that cause delamination of one or more layers. That is, in embodiments, the electrical test circuit 25 of the present invention can detect delamination of the dielectric layers due to a coefficient of thermal expansion (CTE) mismatch between an upper laminate and the materials within the chip and/or solder connection. Advantageously, the electrical test circuit 25 can be easily integrated into the processing scheme of the integrated circuit.

Figure 2:
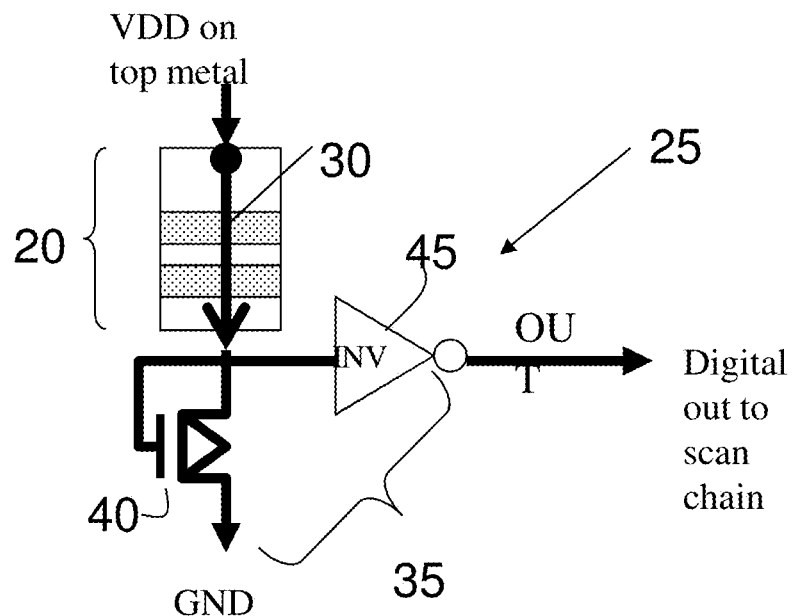
FIG. 2 shows an electrical test circuit in accordance with aspects of the present invention.

FIG. 2 shows an electrical test circuit in accordance with aspects of the present invention. In embodiments, the electrical test circuit 25 includes a single, continuous signal line 30 extending (traversing) between one or more metal layers and, in embodiments, one or more dielectric layers 20, under the shadow of the bump. In embodiments, the continuous signal line 30 traverses through three metal layers, in a vertical direction, and can be any conductive material deposited in a via, which makes contact with and/or traverses between the metal layers 20. As in any of the embodiments, the continuous signal line 30 can be other shapes such as, for example, in a stepped fashion. That is, the continuous signal line 30 can travel laterally after traversing one or more metal and/or dielectric layers.

In embodiments, the continuous signal line 30 is electrically coupled between a known signal value such as VDD (e.g., a top metal layer with a voltage source) and a sense amp 35, which includes a FET 40, e.g., PFET, and an inverter 45 (or a logic gate or a buffer, for example). The FET 40 is electrically coupled to GND (or other potential); whereas, the inverter 45 (or the logic gate or buffer) could be electrically coupled to a scan chain or to a point so the pass or fail can be observed.

As should be understood by those of ordinary skill in the art, the present invention contemplates the use of an inverter, logic gate or a buffer. Hereinafter, although the present invention is described, in many of the below aspects, with the use of an inverter, it should be understood that the inverter can be substituted with a logic gate or buffer, without departed from the scope of the present invention. Also, those of skill in the art should recognize that the known signal value can be, for example, VDD; however, the present invention contemplates any known voltage or signal. Accordingly, although the present invention is described, in many of the below aspects, in the context of VDD, it should now be understood that any known voltage or signal can be substituted, without departing from the scope of the present invention. Likewise, those of skill in the art should recognize that any potential can be used with the present invention such as, for example, but limited to, GND.

The continuous signal line 30 can be manufactured using conventional lithographic, etching and deposition methods. For example, a resist can be formed on a layer of dielectric material, and exposed to light to form openings aligned with one or more metal layers. The dielectric layer is then subject to an etching process, e.g., reactive ion etching (RIE) to form a via to an underlying metal layer. A metal signal line can then be deposited in the via to form the continuous signal line 30. In embodiments, this process can be repeated for each layer, or a combination etch can be performed such that a single via can be extended through several metal layers. This same process can be used for any of the aspects of the present invention such that no further discussion is required herein.

The FET 40 and inverter 45 can be manufactured using any conventional CMOS manufacturing processes. For example, the FET 40 can be manufactured by a deposition of a gate dielectric material, e.g., oxide, and gate body material, e.g., metal, polysilicon or combination thereof, on a silicon layer. The gate dielectric material and the gate body material can be patterned using any conventional etching processes, e.g., reactive ion etching (RIE). A sidewall spacer, e.g., nitride or oxide, can be deposited on the sidewalls of the patterned structure. A source and drain can then be formed using conventional doping and/or implantation processes.

In operation, the continuous signal line 30 detects a signal such as, from VDD, and provides the signal to the sense amp 35. In the case of a structural defect, the signal line 30 will be partially or completely broken. This is due to the delamination or cracking or other structural defects of any of the layers of the structure breaking the signal line. In the scenario when there is no structural defects, e.g., the integrated circuit maintains its integrity during cool down, the signal line 30 will maintain its continuity (e.g., the signal line 30 will not break), and the known signal such as VDD will flow through signal line 30 to the input of the inverter and the output will go (e.g., inverted) to another state, e.g., go low in the case of VDD. The different state signal, e.g., low signal, will indicate no structural defects in the integrated circuit, e.g., no breaks in the signal line 30.

However, in the case of structural defects, e.g., resulting in a partial or complete break in the signal line 30 due to, for example, delamination, cracking, etc. of one or more layers 20, the FET 40 will draw a different signal than the known signal, e.g., such as a low current signal from GND, e.g., FET will be closer to signal GND. The different current signal will pass through the inverter 45, which will go to another state, e.g., in the case of the lower current signal from GND, the signal will go high. The high signal will be indicative of a structural defect in the integrated circuit. In this way, the electrical test circuit 25 detects a certain value from the net and can compare the expected vs. actual voltage to determine the structural integrity of the integrated circuit.

Accordingly, as with all of the embodiments described herein, the detection circuitry is structured to: receive a known signal from the least one signal line when the signal line maintains its continuity; and receive an opposite or different signal from the expectation when the at least one signal line is partially or completely broken. The signal being as expected is indicative of no structural defects detected by the detection circuitry. The signal being different from the expectation is indicative of structural defects detected by the detection circuitry.

Figure 3:
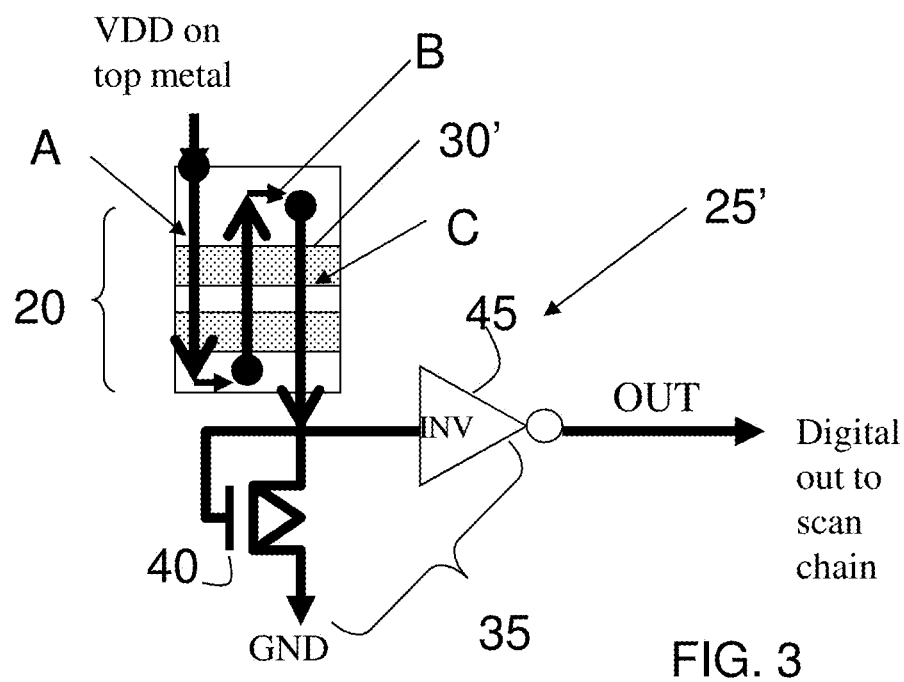
FIG. 3 shows an electrical test circuit in accordance with additional aspects of the present invention.

FIG. 3 shows an electrical test circuit in accordance with additional aspects of the present invention. In embodiments, the electrical test circuit 25' includes a continuous signal line 30' that traverses, e.g., bends or meanders, two or more times through the layers 20 at different physical locations. In the configuration of FIG. 3, the signal line 30' is a continuous metal line in a serpentine shape (e.g., a combination of horizontal and vertical paths) that traverses or extends through the layers 20, under the shadow of the bump, at locations A, B, C; although the present invention contemplates that the continuous signal line 30' can traverse through the layers 20 at other locations along its width (length). In further embodiments, although FIG. 3 shows the signal line 30' traverses through metal/dielectric layers two or more times up and down, it is also contemplated by the present invention that the signal line 30' can traverse in the metal and/or dielectric layers through a different number of layers as it travels through the layers two or more times.

Compared to the electrical test circuit 25 of FIG. 1, the electrical test circuit 25' of FIG. 2 provides a sensitivity to structural defects over a wider range of locations.

The continuous signal line 30' can be any conductive material deposited in a via, which makes contact with and/or traverses through the metal layers 20. Also, in embodiments, the continuous signal line 30' is electrically coupled between a known signal value VDD (e.g., a top metal layer with a voltage source) and a sense amp 35, which includes the FET 40, e.g., PFET, and the inverter 45. The FET 40 is electrically coupled to GND; whereas, the inverter 45 is electrically coupled to a scan chain. As in the previous embodiment, the FET 40 and inverter 45 can be manufactured using any conventional CMOS manufacturing processes.

In operation, the continuous signal line 30' detects a known signal from, e.g., VDD and provides the signal to the sense amp 35. In the case of a structural defect, the signal line 30' will be partially or completely broken. This is due to the delamination, cracking or other structural defect of any of the layers of the structure breaking the signal line. In the scenario when there is no structural defects, e.g., the integrated circuit maintains its integrity during cool down, the signal line 30' will maintain its continuity (e.g., the signal line 30 will not break), and the known signal, e.g., VDD, will flow through signal line 30' to the input of the inverter and the output will go (e.g., inverted) another state, e.g., in the case of VDD, the output will go low. The signal, e.g., low signal, will indicate no structural defects in the integrated circuit, e.g., no breaks in the signal line 30'.

However, in the case of structural defects at or near any location of the signal line 30', e.g., resulting in a partial or complete break in the signal line 30' due to delamination or other structural defect of one or more layers 20 at or near locations A, B, C, the FET 40 will draw a different potential, e.g., low current signal from GND, e.g., FET will be closer to GND. The different current signal, e.g., low current signal, will pass through the inverter 45, and the output will go to a different state, which in this case will go high. The high signal will be indicative of a structural defect in the integrated circuit. In this way, the electrical test circuit 25' detects a certain value from the net and can compare the expected vs. actual voltage to determine the structural integrity of the integrated circuit.

Figure 4:
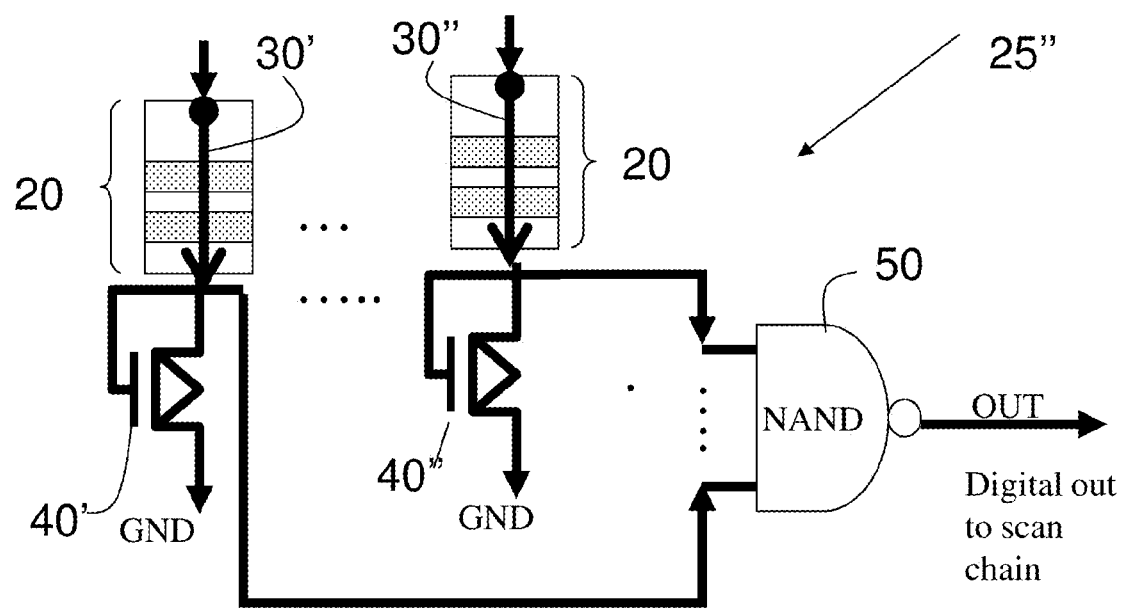
FIG. 4 shows an electrical test circuit in accordance with additional aspects of the present invention.

FIG. 4 shows an electrical test circuit in accordance with aspects of the present invention. In embodiments, the electrical test circuit 25" includes two or more continuous signal lines 30' and 30" extending between two or more metal layers 20, under the shadow of the bump(s). In embodiments, the two or more continuous signal lines 30' and 30" are provided in a vertical direction; although in embodiments, any of the signal lines 30' and 30" can also be a serpentines shape. The electrical test circuit 25" can be provided under the bump. As described in the embodiment of FIG. 3, the present invention also contemplates that the signal lines 30' and/or 30" can traverse in the metal and/or dielectric layers through a different number of layers as it travels through the layers two or more times.

In embodiments, the signal lines 30' and 30" can be any conductive material deposited in a via at different locations along the same or different metal levels within layers 20. The signal lines 30' and 30" are each electrically coupled to a known signal value, e.g., VDD (e.g., a top metal layer with a voltage source) and a respective FET 40' and 40", e.g., PFET. The FETs 40' and 40" are electrically coupled to GND and to respective inputs 50' and 50" of a NAND gate 50, which could be electrically coupled to a scan chain or to a pin where the pass/fail can be observed. The NAND gate 50 can be manufactured using any conventional CMOS manufacturing processes as discussed above. In embodiments, the VDD signal can be from the same or a different source. Although a NAND is used, several different circuit designs can accomplish the intent of this circuit design (e.g., AND, OR, NOR, Comparator, etc.)

In operation, the continuous signal lines 30' and 30" detect a signal from VDD and provides the signal to the respective FET 40' and 40". In the case that the integrated circuit has no structural defect, the continuous signal lines 30' and 30" will maintain their continuity, and the known signal, e.g., VDD, will flow through the continuous signal lines 30' and 30" to the input of the NAND gate 50 and the output will go (e.g., inverted) to a different state, e.g., go low in the case of VDD. The low signal will indicate no structural defects in the integrated circuit, e.g., no breaks in the signal lines 30' and 30".

However, in the case of structural defects, e.g., resulting in a partial or complete break in one or more of the signal lines 30' and 30" due to delamination of one or more layers 20, a respective FETs 40' or 40" will draw a different potential, e.g., low current signal from GND, e.g., FET will be closer to GND. The low current signal will pass through the NAND gate 50, which will then go high. In this scenario, even if one of the metal lines pulls VDD, the NAND gate will still be high due to the low current from GND, drawn from another of the FETs associated with a broken line. The high signal will be indicative of a structural defect in the integrated circuit. In this way, the electrical test circuit 25" detects a certain value from the net and can compare the expected vs. actual voltage to determine the structural integrity of the integrated circuit.

Figure 5:
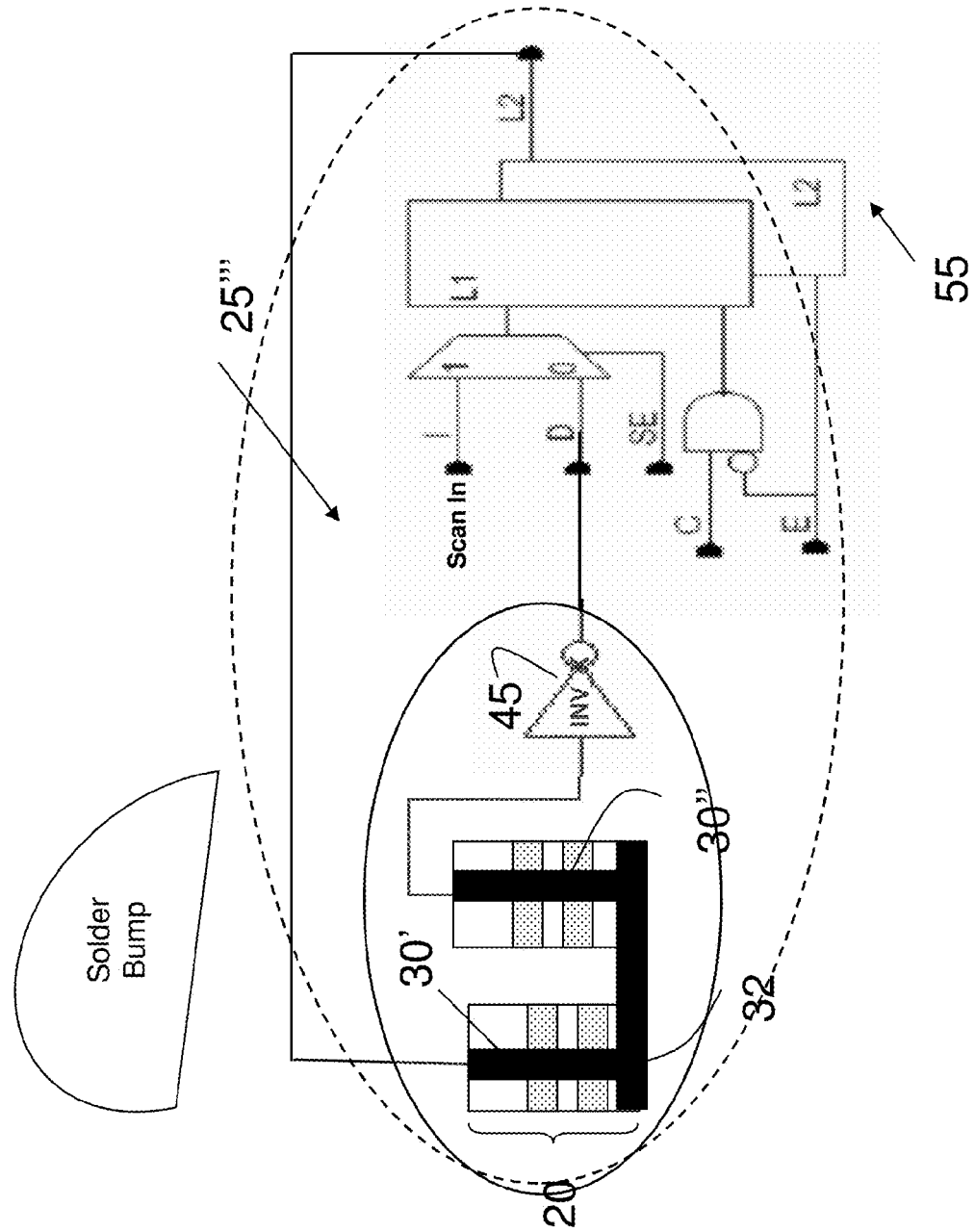
FIG. 5 shows an electrical test circuit in accordance with additional aspects of the present invention.

FIG. 5 shows an additional aspect of the present invention. In the configuration of FIG. 5, the electrical test circuit 25''' includes two or more continuous signal lines 30' and 30" extending between two or more dielectric layers and metal layers 20, under the shadow of the solder bump. In embodiments, the signal lines 30' and 30" can be any conductive material deposited in a via at different locations along the same or different metal levels within the two or more metal layers 20. In embodiments, any of the signal lines 30' and 30" can also be a serpentines shape.

The signal lines 30' and 30" are each electrically coupled to one another by signal line 32. The signal line 30" is also electrically coupled to the inverter 45. Although not a requirement, a circuit option to observe if there is a structural defect is to use logic 55 which is electrically coupled to inverter 45. Another alternative would be to tie the output of the inverter 45 to a pin/circuit that can be used to observe if there is a pass/fail and also tie it back to 30' to complete the loop. The logic 55 and inverter 45 can be manufactured using any conventional CMOS manufacturing processes as discussed above.

In operation, a voltage is scanned into the logic 55 and that value will be presented on signal line 30'. If there is no structural defect in 30', 32, or 30", then that signal will propagate to the input of the latch where the value can be scanned out. Next the opposite polarity is scanned in, and that value will propagate thru signal line 30', 32, 30", and the inverter, then to the latch where it can be scanned out. If the data scanned out is the inverted pattern of what was scanned in (e.g., if a buffer was used instead of the inverter, the input and output data would be the same polarity), there is no structural defect, otherwise there is.

Figure 6:
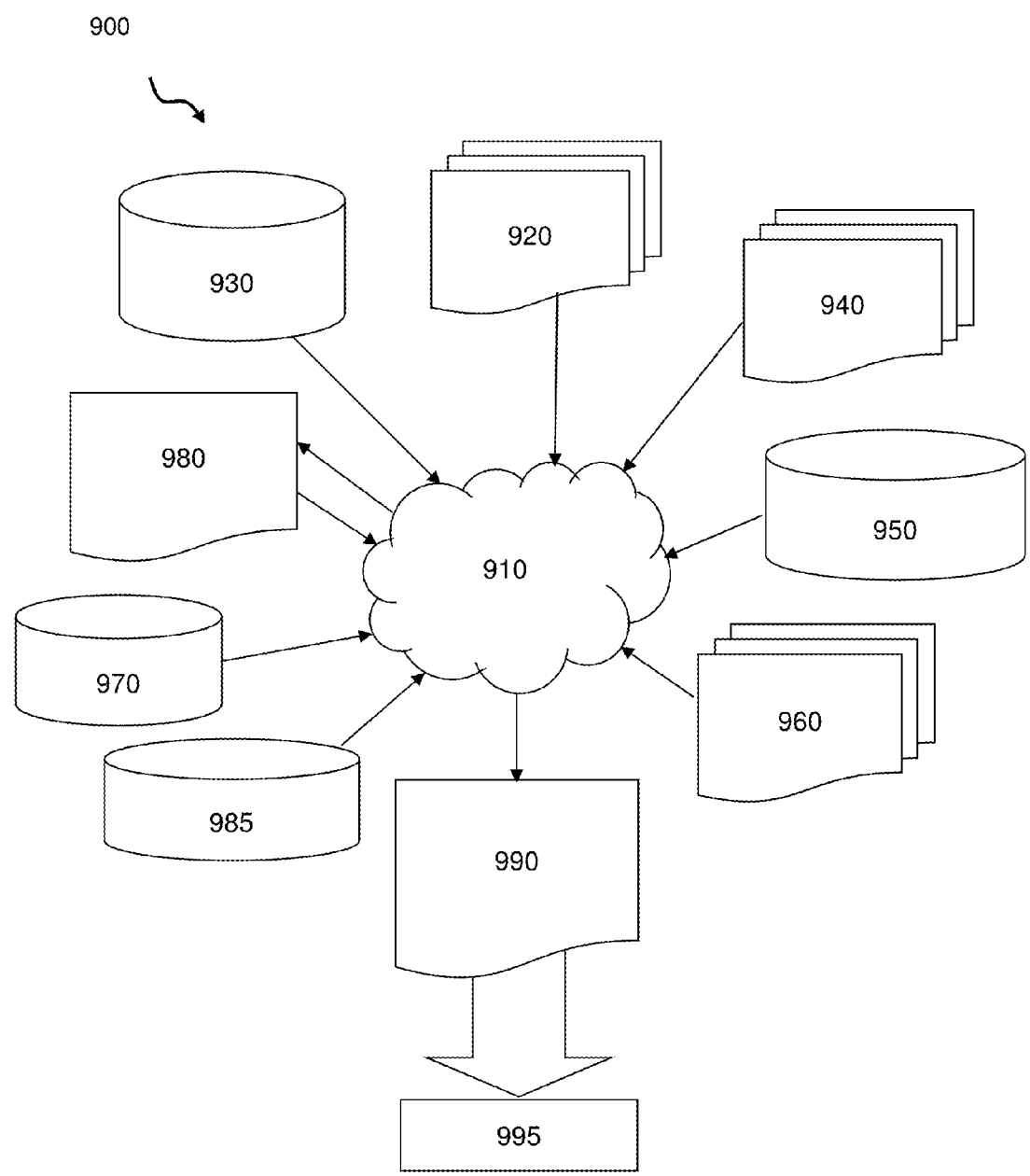
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure, comprising:
   an electrical test circuit structured to detect a structural defect in an integrated circuit, wherein the electrical test circuit comprises:
   a first signal line and a second signal line both of which are extending between two or more dielectric layers and metal layers of the integrated circuit;
   an inverter connected to the first signal line;
   logic connected to the inverter and the second signal line; and
   a first field effect transistor connected to the first signal line and a ground which will draw a different signal than a known signal when the structural defect is in the integrated circuit, wherein an output of the logic provides an input signal to the second signal line.

2. The structure of claim 1, wherein:
   an input of the inverter is connected to the first signal line; and
   an output of the inverter is connected to an input of the logic.

3. The structure of claim 1, further comprising:
   a third signal line that electrically couples the first signal line to the second signal line; and
   a second field effect transistor connected to the second signal line and a ground,
   wherein the first signal line and the second signal line are electrically coupled to the known signal which is a drain supply VDD that flows through to an input of the inverter so that when there are no structural defects an output of the inverter will go low in relation to VDD, when there are structural defects the output of the inverter will go high in relation to VDD and the first field effect transistor and the second field effect transistor will draw a different potential such that the first field effect transistor and the second field effect transistor will be close to ground.

4. The structure of claim 1, wherein the logic comprises a latch.

5. The structure of claim 1, wherein the first signal line to the second signal line are under a shadow of a solder bump.

6. The structure of claim 1, wherein an output of the inverter is electrically tied to an end of an observation pin that observes a pass or a fail of the electrical test circuit, and the other end of the observation pin is tied to the second line to complete a loop of the electrical test circuit with a scan chain electrically coupled to the logic.

7. A structure, comprising:
   an electrical test circuit structured to detect a structural defect in an integrated circuit, wherein the electrical test circuit comprises:
   a first signal line and a second signal line both of which are extending between two or more dielectric layers and metal layers of the integrated circuit;
   a first field effect transistor connected to the first signal line, a ground and to a first input of a gate; and
   a second field effect transistor connected to the second signal line, a ground and to a second input of the gate,
   wherein the first signal line and the second signal line are electrically coupled to a known drain supply VDD that flows through to an input of the gate so that when there are no structural defects an output of the gate will go low in relation to VDD, when there are structural defects the output of the gate will go high in relation to VDD and the first field effect transistor and the second field effect transistor will draw a different potential such that the first field effect transistor and the second field effect transistor will be close to ground.

8. The structure of claim 7, wherein an output of the gate is coupled to a scan chain.

9. The structure of claim 7, wherein:
   the first field effect transistor is connected to ground; and
   the second field effect transistor is connected to ground.

10. The structure of claim 7, wherein the first field effect transistor and the second field effect transistor each comprise a p-type field effect transistor (PFET).

11. The structure of claim 7, wherein a VDD signal is coupled to each of the first signal line and the second signal line.

12. The structure of claim 7, wherein the gate is a NAND gate.

13. A method of manufacturing a device, comprising:
   forming a first signal line and a second signal line both of which are extending between two or more dielectric layers and metal layers of an integrated circuit;
   forming a first field effect transistor connected to the first signal line and to a first input of a gate;
   forming a second field effect transistor connected to the second signal line and to a second input of the gate;
   coupling the gate to an inverter;
   tying an output of the inverter to an observation circuit; and
   tying the output of the inverter to the first signal line to form a loop.

14. The method of claim 13, wherein the first signal line, the second signal line, the first field effect transistor, the second field effect transistor, and the gate are comprised in an electrical test circuit configured to detect a structural defect in an integrated circuit.

15. The method of claim 13, wherein an output of the gate is coupled to a scan chain.

16. The method of claim 13, wherein:
   the first field effect transistor is connected to ground; and
   the second field effect transistor is connected to ground.

17. The method of claim 13, wherein the first field effect transistor and the second field effect transistor each comprise a p-type field effect transistor (PFET).

18. The method of claim 13, wherein a VDD signal is coupled to each of the first signal line and the second signal line.

19. The method of claim 13, wherein the gate is a NAND gate.

* * * * *